United States Patent
Mouffron

(10) Patent No.: US 8,615,537 B2
(45) Date of Patent: Dec. 24, 2013

(54) METHOD FOR ENCODING INFORMATION USING NON LINEAR EVENLY DISTRIBUTED FUNCTIONS AND COMPUTER SOFTWARE FOR IMPLEMENTING SAID METHOD

(75) Inventor: Marc Mouffron, Saint Remy les Chevreuse (FR)

(73) Assignee: Eads Secure Networks, Elancourt (FR)

( * ) Notice: Subject to any disclaimer, the term of this patent is extended or adjusted under 35 U.S.C. 154(b) by 894 days.

(21) Appl. No.: 12/637,127

(22) Filed: Dec. 14, 2009

(65) Prior Publication Data

US 2010/0138462 A1  Jun. 3, 2010

Related U.S. Application Data

(63) Continuation of application No. PCT/FR2008/051068, filed on Jun. 13, 2008.

(30) Foreign Application Priority Data

Jun. 14, 2007 (FR) ...................................... 07 04243

(51) Int. Cl.
  *G06F 1/02* (2006.01)
(52) U.S. Cl.
  USPC ............................................ 708/270; 380/28
(58) Field of Classification Search
  None
  See application file for complete search history.

(56) References Cited

U.S. PATENT DOCUMENTS

| 5,229,768 A | 7/1993 | Thomas |
| 5,892,940 A * | 4/1999 | Mangelsdorf .................... 703/16 |
| 6,397,370 B1 | 5/2002 | Fernandez et al. |
| 6,868,536 B2 | 3/2005 | Gasanov et al. |
| 6,961,427 B1 | 11/2005 | Qiu et al. |
| 2003/0219119 A1* | 11/2003 | Kocarev et al. .................. 380/28 |
| 2007/0208791 A1* | 9/2007 | Short ............................. 708/203 |

OTHER PUBLICATIONS

Ars Gwénolé, Faugere Jean-Charles: "Algebraic Immunities of functions over finite fields", INRIA Raport de recherche N° 5532, mars 2005.

Butler Jon T., Herscovici David S., Sasao Tsutomu, and Barton Robert J.: "Average and Worst Case Number of Nodes in Decision Diagrams of Symmetric Multiple-Valued Functions", IEEE Transactions on Computers, Vol. 46, N° 4, Apr. 1997.

Cameron Peter J.: "Permutation Groups". London Math. Soc. Student Texts 45, Cambridge Univ. Press, Cambridge, 1999.

(Continued)

*Primary Examiner* — Michael D Yaary

(74) *Attorney, Agent, or Firm* — Miller, Matthias & Hull LLP

(57) ABSTRACT

The invention related to a method for encoding information using non-linear evenly distributed functions, that comprises the following steps for building such a function: selecting a first natural integer n, a first set En of cardinal n, a group G operating on said first set En, a second natural integer q and a second set Eq of cardinal q; defining a set OG of the orbits of the group G operating on vectors of n elements in the set Eq, a function Π that, for each vector of the n elements of the set Eq, associates the corresponding orbit and a second function Φ allocating to each orbit of the group G a value of the set Eq; evenly distributing into a number q of sections the sums of the cardinals of the orbits of the group; defining a third function F comprising the first and second functions ΦoΠ.

12 Claims, 1 Drawing Sheet

(56) References Cited

OTHER PUBLICATIONS

Camion Paul, Canteaut Anne. : "Generalization of Siegenthaler inequality and Schnorr-Vaudenay multipermutations." In : *Advances in Cryptology—CRYPTO '96*, 'ed. par Koblitz (N.), Lecture Notes in Computer Science, n° 1109, Springer-Verlag, 1996.

Canteaut Anne, Videau Marion "Symmetric Boolean Functions" IEEE Transactions on Information Theory, vol. 51, N° 8, pp. 2791-2811, Aug. 2005.

Chen Hao, Li Jianhua : "Lower Bounds on the Algebraic Immunity of Boolean Functions". Available at http://arxiv.org/abs/cs.CR/0608080.

Dixon John D., Mortimer Brian. : "Permutation Groups". Springer-Verlag, 1996.

Lai, X. and Massey, James. : "A proposal for a new block encryption standard" in I. Damgard, editor, Advances in Cryptology—EUROCRYPT '90, vol. 473 or Lecture Notes in Computer Science, pp. 389-404. Springer-Verlag 1991.

Lobanov Mikhail : "Tight bound between nonlinearity and algebraic immunity" Cryptology ePrint Archive, Report 2005/441, http://eprint.iacr.org/.

Sarkar Sumanta and Maitra Subhamoy : "Balancedness and Correlation Immunity of Symmetric Boolean Functions" in Proc. R.C. Bose Centenary Symposium, vol. 15 of Electronic Notes in Discrete Mathematics, pp. 178-183, 2003.

Siegenthaler Thomas : "Correlation immunity of non-linear functions for cryptographic applications" IEEE Trans. On Information Theory pp. 776-780, Sep. 1984.

Stanica Pantelimon and Maitra Subhamoy : "Rotation symmetric Boolean Functions : Count and cryptographic properties" Proceedings of R.C. Bose Centenary Symposium on Discrete Mathematics and Applications, Indian Statistical Institute, Calcutta, Dec. 2002.

* cited by examiner

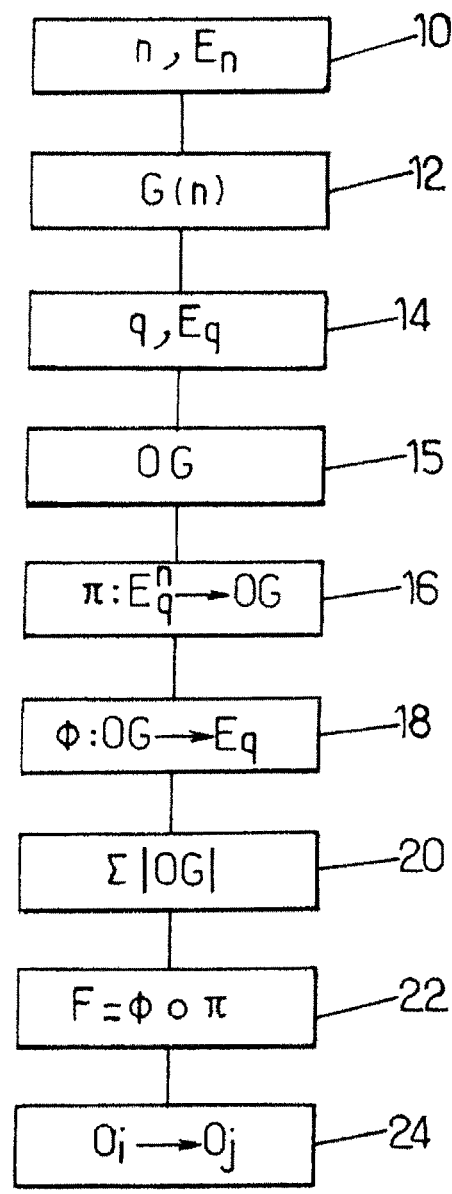

METHOD FOR ENCODING INFORMATION USING NON LINEAR EVENLY DISTRIBUTED FUNCTIONS AND COMPUTER SOFTWARE FOR IMPLEMENTING SAID METHOD

CROSS-REFERENCE TO RELATED APPLICATIONS

This application is a U.S. national stage filing of International Patent Application No. PCT/FR2008/051068 filed on Jun. 13, 2008, which claims priority under the Paris Convention to the French Patent Application No. 07 04243, filed on Jun. 14, 2007.

FIELD OF THE DISCLOSURE

The present invention relates to a method of encoding information using evenly distributed nonlinear functions. It also relates to a computer program for implementing the method.

BACKGROUND OF THE DISCLOSURE

In many fields, notably in cryptography and data classification, it is necessary to obtain, from a large quantity of data, a result dependent on all these data simultaneously. For this, it is therefore necessary to have functions that have a very large quantity of input variables and be able to calculate their result effectively in a short time or with weak means. Usually, simple functions are used, that can be constructed with numerous variables and basic operations. Low degree linear functions or polynomials are therefore typically used. They are actually easy to calculate but often present properties or behaviors that are prohibitive, such as, for example, a poor distribution of the results. The effective production of non-simplistic functions that have a large number of input variables is therefore a prime requirement.

The evenly distributed nonlinear functions are very useful as hashing function for the optimum classification of data by hashing or search tree.

The use of hashing functions is, for example, described in the patent U.S. Pat. No. 5,229,768 which cites the "middle of square function" and "modulo function" hashing functions. The first is nonlinear but is limited to a restricted number of variables because the complexity of the square increases very rapidly. This function is not evenly distributed and is therefore not optimal as a hashing function for classification. The second is linear and is not always evenly distributed. Consequently, it can lead to distributions of the hashing that are biased and non-optimal on linearly dependent conventional data. The cluster phenomenon, provoked by the nonlinearity or the simplicity of the classification function, must be avoided because it penalizes the searches on the classified data. The even distribution is a necessary condition for achieving the optimum search time, a time that is a logarithmic function of the quantity of classified data. The nonlinear classification functions that produce a uniform distribution are therefore the best, but are in practice difficult to find.

With the explosion in the quantities of data processed, the use of rapid hashing functions to be calculated over a very large quantity of variables and with properties such as non-linearity and even distribution is therefore crucial.

For cryptography, the choice of evenly distributed nonlinear functions is essential to ensure the quality of a cryptographic algorithm. In addition, as the detailed properties described hereinbelow show, these functions become all the better as their quantity of input variables n increases.

In any cryptographic method, the use of nonlinear functions, that is to say with an algebraic degree d strictly greater than 1, is a fundamental need. It is also necessary for these nonlinear elements integrated in the cryptographic method to have a certain number of additional properties. Thus, the use of nonlinear functions that have high order correlations protects a cryptographic algorithm from certain attacks. It is therefore an essential requirement analyzed by Siegenthaler who was the first to indicate the compromise between the order of the correlations t, the algebraic degree d and the number of input variables n of the Boolean functions in the form:

$$d+t<n.$$

The Walsh transform in addition proves that the correlation of a Boolean function with a given number of input variables n has a minimum correlation value decreasing with n. The extension of these results established over GF(2) with the Galois field GF(q) has been given by Camion et al in the form:

$$d+t<(q-1)n.$$

More recent results on other attacks such as the algebraic attacks show the need to use functions that have a high algebraic immunity.

The two constraints mentioned here, as well as other similar properties, therefore urge the use of functions that have many input variables. However, the technology limits the possibilities of producing such functions. The biggest memories currently available contain 128 Gbits in flash memory form. This means that they can process only 37 input Boolean variables, which is few in light of the current needs: it is desirable to use a function that has a hundred or so binary or q-ary input variables to ensure the properties sought.

Another important property of the functions used in cryptography is their even distribution. It is also a necessary condition for the minimization of the correlations stated previously.

It is therefore desirable to be able to effectively produce an evenly distributed binary or q-ary nonlinear function with many input variables despite the limits of the current technology.

In the prior art, various solutions have already been proposed to effectively produce Boolean functions or over an extended Galois field GF($2^n$). For example, the patents U.S. Pat. No. 6,397,370, U.S. Pat. No. 6,961,427 or even U.S. Pat. No. 6,868,536 propose such functions.

However, those skilled in the art find that these examples from the prior art:
- are restricted to the case of Boolean functions, or
- do not offer constructive solutions for producing the right functions and their heuristic search methods give no guarantee of results, or
- offer solutions with no guarantee as to their even distribution properties, or
- offer solutions with no guarantee as to the algebraic properties such as the algebraic degree of the functions, or
- do not exactly quantify the complexity of implementation of the functions, or
- offer solutions only for a few tens of variables at most.

SUMMARY OF THE DISCLOSURE

It is therefore desirable to produce methods of constructing partially symmetrical binary or q-ary functions, notably transitive, t-transitive or symmetrical functions that do not have the drawbacks mentioned previously.

Thus, according to one aspect of the invention, a method of encoding information by the use of evenly distributed nonlinear functions comprises the following steps for constructing such a function:

- selection of a first natural integer, and of a first set comprising a number of elements equal to this first natural integer,
- selection of a group working on this first set,
- selection of a second natural integer and of a second set comprising a number of elements equal to this second natural integer,
- definition of a set of the orbits of the group working on the vectors of n elements of the second set,
- definition of a first function which, with each of the vectors of n elements of the second set, associates the corresponding orbit,
- definition of a second function assigning to each of the orbits of the group a value from the second set,
- even distribution in a number of sections equal to the second natural integer of the sums of the cardinals of the orbits of the group by use of the mathematical properties of said cardinals,
- definition of a third function which is the composite of the first and second functions.

The method advantageously makes it possible to systematically obtain new functions that have the desired properties. It also makes it possible to obtain functions on any sets with q elements that do not need to be Boolean fields GF(2), nor even an extension to a Galois field GF($2^n$), nor even an extension to a field GF($p^n$) while also being applied to the particular cases of the prior art for which it provides new functions.

The method of producing symmetrical and partially symmetrical q-ary functions that is proposed advantageously overcomes the limitations of the prior art, illustrated previously, and makes it possible to produce functions of hundreds or thousands of Boolean or q-ary variables with a rapid program or in a silicon surface area that is negligible compared to a 128 Gbit flash memory. The method of the present invention can be comfortably produced by a computer or other processor programmed appropriately. Alternatively, the method can be produced by hardware specially designed for the purpose.

The partially symmetrical binary or q-ary functions thus allow for a variety of construction of evenly distributed nonlinear functions that are essential for producing cryptographic methods or data classification methods.

According to other characteristics or embodiments:

- the method comprises a subsequent step of optimizing the nonlinearity or the algebraic degree or an algebraic property of the third function by swapping orbits;
- the method comprises a subsequent step of composition at the input, as at the output, with other evenly distributed nonlinear functions so that the overall compound obtained by this step is also nonlinear and evenly distributed;
- the first and second natural integers not being primes between them, the second set being a commutative ring and the group being the set of the permutations such that the orbits are the entire partitions whose shares are strictly less than the second natural integer, the step of definition of a first function comprises a substep of construction of a symmetrical affine function:

$$L_{a,b}(x) = b\left(\sum_{i=1}^{n} x_i\right) + a$$

in which a is any element of the second set and b a unit of the second set and $(x_i)_{i=1}{}^n$ is a vector with n elements of the second set;

- the first and the second natural integers being strictly greater than 2 and primes between them, the set being a commutative ring and the group being the set of the permutations whose orbits have as cardinals the multinomial coefficients, the step of definition of a first function comprises the selection of the trivial evenly distributed functions;
- the selection of trivial evenly distributed functions consists in applying a circular permutation with an offset by a third natural integer over a q-uplet such that, for each value of this third natural integer:

$$M(n,dk(r_1,r_2,\ldots,r_q))=M(n,r_1,\ldots,r_q)$$

in which $r_1, \ldots, r_q$ are multinomial coefficients; then,

- where appropriate, there is performed a subsequent step of variation of said function by the swapping of orbits having identical cardinals and/or the grouping together of orbits having cardinals that are multiples of one another;
- a third natural number and the second natural number are chosen such that the first natural number is equal to the second natural number to the power of the third natural number, said group being a transitive group, the step of definition of a function comprises the substeps of:
  - definition of a transitive Boolean function having a number of variables equal to the first natural number and displaying a Boolean value at each of the orbits of the group, apart from the orbits and,
  - calculation of a value, the sum for all the values of the first natural integer of the product of the binomial coefficient with the first Boolean function modulo 2, or $$T = \sum_{j=1}^{n-1} C_{n-1}^{j} h(0^{n-j}1^j) \mod(2),$$

- calculation of the value of the first Boolean function for the orbits such that:

$h(O^n)=(T+1) \mod 2$ and $h(1^n)=T$ if $p$ is even, and $h(O^n)=T$ and $h(1^n)=(T+1) \mod 2$ if $p$ is odd;

- a fourth natural number, a third natural number and the second natural number are chosen such that the first natural number is equal to the sum of the second natural number to the power of the third natural number and the fourth natural number minus 1, the group being a t-transitive group, the step of definition of a function comprises the substeps of:
  - definition of a t-transitive group of order equal to the second natural number to the power of the third natural number,
  - definition of a transitive Boolean function having a number of variables equal to the second natural number to the power of the third natural number and as group of symmetry, the t-transitive group, definition of a t-transitive Boolean function having a number of variables equal to the first natural number by extension of the transitive Boolean dependent on a number of operands equal to the fourth natural number minus 1.

According to another aspect, a computer program product comprising program code instructions for the execution of the steps of the preceding method when said program is run on a computer.

BRIEF DESCRIPTION OF THE DRAWINGS

The invention will be better understood on reading the following description, given purely by way of example, and given in light of the appended figures in which:

FIG. 1 is a flow diagram of one embodiment of the method according to the invention.

DETAILED DESCRIPTION OF THE DISCLOSURE

With reference to FIG. 1, a method of encoding information by the use of evenly distributed nonlinear functions comprises the following steps for constructing such a function:

- selection of a first natural integer n, and of a set En comprising a number of elements equal to this first natural integer n, step 10;
- selection of a group G working on the set En and therefore the degree of which is equal to this first natural integer n, step 12; and
- selection of a second natural integer q and of a set Eq comprising a number of elements equal to this second natural integer q, step 14;
- definition of the set OG of the orbits of the group G working on the vectors of n elements of Eq, step 15; and
- definition of the function Π which with each of these vectors associates the corresponding orbit in OG, step 16, in other words Π: Eq$^n$→OG; {∀ u ∈ E$_q^n$, Π (u)=O$_i$, O$_j$ ∈ OG};
- definition of a function Φ of OG on Eq assigning each of the orbits of the group G a value from the set Eq, step 18, in other words Φ: OG→Eq such that {∀O$_i$ ∈ OG, Φ(O$_i$)=V$_j$, V$_j$ ∈ Eq},
- even distribution of the sums of the cardinals of the orbits of the group G over the set of the values of Eq by the use of the mathematical properties of said cardinals, step 20. There are thus obtained q evenly distributed sections of sums of these cardinals. The mathematical properties of the cardinals used are, for example, the binomial coefficients, the multinomial coefficients, the partitions, the symmetry of the cardinals of the orbits, the divisibility of the cardinals, the properties of the elements of Eq, etc.
- definition of a function F=ΦoΠ, F being the composite of the two preceding functions, step 22.

Thus, the function F=ΦoΠ is such that, for each value W$_j$, j=1 to q, of Eq, the sum of the cardinals of the vectors u of Eq$^n$ such that F(u)=W$_j$ is constant. It is therefore evenly distributed.

If necessary, step 24, the values of certain orbits are swapped to obtain the nonlinearity or a maximum algebraic degree of the function or any other algebraic property of the function F.

It should be noted that the duly constructed functions can advantageously be composed at the input as at the output with other evenly distributed nonlinear functions such that the compound is also nonlinear and evenly distributed.

The advantage of the invention will be better understood on reading a particular case, the description of which is given hereinbelow purely by way of example. Thus, whereas for q=2 and for certain even values n (for example 4, 6, 10, 12, 16, 18, 22, 28, 30, 36, 40, 42, 46, 52, 58, 60), there is no symmetrical evenly distributed nonlinear function, the method makes it possible to produce for q>2 and for any number of inputs n, a symmetrical evenly distributed nonlinear function. For example, there is no evenly distributed nonlinear function of 60 binary variables among the symmetrical functions. However, the method described hereinabove provides at least eight symmetrical 4-ary functions of 15 evenly distributed nonlinear variables, which correspond to Boolean functions of 60 evenly distributed and nonlinear variables.

The general method described hereinabove is implemented according to a number of embodiments. Four particular embodiments will now be described by way of example, those skilled in the art being able to define others therefrom based on the preceding general description.

In a first embodiment, values of n are chosen that are strictly greater than 5 and values of q are chosen that are strictly greater than 2, such that they are not primes between them, that is to say that their pgcd(n,q)≠1.

The set Eq is chosen as a commutative ring with q elements. For example, the set Eq is the ring Z/qZ or the Galois field GF(q).

Any element of E$_q$ is denoted a. We will use b to denote a unit of E$_q$, that is to say an element of E$_q$ that accepts an inverse for the second law of the ring that is commonly called multiplication. A symmetrical affine function with n variables:

$$L_{a,b}(x) = b\left(\sum_{i=1}^{n} x_i\right) + a$$

in which the variables of the function are denoted $$x = (x_i)_{i=1}^{n}.$$

Since the number of units, or cardinal of the group of the units, in E$_q$ is u(E$_q$), q.u(E$_q$) evenly distributed symmetrical affine functions are thus constructed. For example, in Z/qZ, u(E$_q$)=Φ(q) and in GF(q) it is Φ(q)=q−1.

The group G of degree n is then defined as the set of the permutations S$_n$ and the function L defines an action of the group G, or S$_n$, on the set Eq$^n$.

A partition of an integer n is a decomposition of this integer in the form of a sum of natural integers called shares of this partition. It is also possible to be restricted to a subset of the set of all the partitions by imposing a limit on the number of shares in the partition, or by imposing a limit on the whole shares involved in the sum.

The symmetrical functions are then constructed as indicated previously from the orbits of the elements of Eq$^n$. The orbits are determined by all the whole partitions of the integer n.(q−1) into n shares strictly less than q. In practice, any vector u of Eq$^n$ comprises n elements (therefore n shares) each less than q (since it is derived from Eq) and the total sum of which is equal to or less than n·(q−1).

Since n is strictly greater than 5, there are natural integers r and s, with s=2 (mod q), such that n=3s+r. Two numbers r and s that satisfy this relation are chosen. Partitions u, z, v, w of n into at most q elements are defined from a partition of r into q−2 elements (r$_2$, ... r$_{q-1}$):

u=s+1, r$_2$, ... r$_{q-1}$, 2s+1
z=2s+1, r$_2$, ... r$_{q-1}$, s+1
v=s, r$_2$, ... r$_{q-1}$, 2s+2
w=2s+2, r$_2$, ... r$_{q-1}$, s.

From the functions $L_{a,b}$ hereinabove and the particular partitions u, z, v, w, functions $G_{a,b}$ are defined by:

$G_{a,b}(x)=L_{a,b}(x)$ if x is different from u, v or w
$G_{a,b}(u)=L_{a,b}(v)$
$G_{a,b}(v)=L_{a,b}(u)$
$G_{a,b}(w)=L_{a,b}(u)$ and functions $H_{a,b}$ are defined by:

$H_{a,b}(x)=L_{a,b}(x)$ if x is different from z, v or w
$H_{a,b}(z)=L_{a,b}(v)$
$H_{a,b}(v)=L_{a,b}(z)$
$H_{a,b}(w)=L_{a,b}(z)$.

All the functions $G_{a,b}$, $H_{a,b}$ thus produced are nonlinear evenly distributed functions. It is also possible to construct, for values of n that are indefinitely great such that pgcd(n,q)≠1, up to $2.q.u(E_q)$ nonlinear evenly distributed functions. In any commutative ring of q elements, q being strictly greater than 2, the number of productions of nonlinear evenly distributed functions is therefore $2.q.u(E_q) \geq 2$ q>4.

As an applied example, q is chosen to be equal to 16 or $2^4$ and $E_q$ is the Galois field $GF(2^4)$. The $C_{121}^{15}$ symmetrical functions of n=106 variables are considered on this field, so n=106=3*2+100. By considering the formula n=3s+r hereinabove, we obtain s=2 and r=100 which also satisfies the property s=2(mod 16) hereinabove.

With s=2, we obtain s+1=3 and 2s+1=5, 2s+2=6. Consequently, u=3 times 1, 5 times 0 and the other 98 values are any,
z=5 times 1, 3 times 0 and the other 98 values are any,
v=2 times 1, 6 times 0 and the other 98 values are any,
w=6 times 1, 2 times 0 and the other 98 values are any.

There is then constructed a nonlinear evenly distributed function of 106 variables in $E_q$={0, 1, 2, 3, 4, 5, 6, 7, 8, 9, a, b, c, d, e, f} which coincides with the function $$L_{9,3}(x) = 3\left(\sum_{i=1}^{106} x_i\right) + 9$$

except when the number of is or zeros in the input 106-uplet have the value 2, 3, 5, 6, in which case the value is that of:

$G_{9,3}(x)=L_{9,3}(x)$ if x is different from u, v or w
$G_{9,3}(u)=L_{9,3}(v)$
$G_{9,3}(v)=L_{9,3}(u)$
$G_{9,3}(w)=L_{9,3}(u)$.

In another exemplary embodiment, n=16=3*2+10 is chosen. Thus, we define s=2 and r=10 which correctly satisfies the property s=2(mod 16).

Since s=2, s+1=3, 2s+1=5 and 2s+2=6. Thus, u=3 times 1, 5 times 0 and the other 8 values are any;
z=5 times 1, 3 times 0 and the other 8 values are any;
v=2 times 1, 6 times 0 and the other 8 values are any;
w=6 times 1, 2 times 0 and the other 8 values are any.

In this example, two nonlinear evenly distributed functions of 16 variables are constructed in $E_q$={0, 1, 2, 3, 4, 5, 6, 7, 8, 9, a, b, c, d, e, f} which coincide:

with the function $$L_{9,3}(x) = 3\left(\sum_{i=1}^{16} x_i\right) + 9$$

except when the number of is or zeros in the input 16-uplet is 2, 3, 5, 6, in which case the value is that of:

$H_{9,3}(x)=L_{9,3}(x)$ if x is different from u, v or w
$H_{9,3}(u)=L_{9,3}(v)$
$H_{9,3}(v)=L_{9,3}(z)$
$H_{9,3}(w)=L_{9,3}(z)$ or with the function $$L_{11,5}(x) = 5\left(\sum_{i=1}^{16} x_i\right) + 11$$

$G_{11,5}(x)=L_{11,5}(x)$ if x is different from u, v, w
$G_{11,5}(u)=L_{11,5}(v)$
$G_{11,5}(v)=L_{11,5}(u)$
$G_{11,5}(w)=L_{11,5}(u)$.

In a second embodiment, values of n are chosen that are strictly greater than 2 and values of q are chosen that are strictly greater than 2 such that n and q are primes between them. The set Eq is chosen to be a commutative ring. The starting functions are then no longer the affine functions, as in the first embodiment, but trivial evenly distributed functions f that exist thanks to the choices of n and q as primes between them.

The group G of degree n is, in this embodiment, the set of the permutations $S_n$, and its orbits have as cardinals the multinomial coefficients.

These functions f are constructed according to the relations on multinomial coefficients.

Let dk be a circular permutation with an offset k over a q-uplet.

For each value of k the following relation applies: $M(n, dk(r_1, r_2, \ldots, r_q))=M(n, r_1, r_2, \ldots, r_q)$ with $$\sum_{i=1}^{q} r_i = n.$$

When n and q are primes between them, we obtain different offsets of the q $r_i$ because the $r_i$ cannot all be equal. Because if the $r_i$ were all equal to d then q.d=n which contradicts the primality of q and n.

We thus succeed in defining $(q!)^{C_{n-q-1}^{n-1}/q}$ evenly distributed symmetrical functions f.

It should be noted that, for q strictly greater than 2, v and w cannot be obtained by an offset one from the other but by a transposition. Thus, in the case where n and q are primes between them, because of the construction of the trivial evenly distributed functions f, the latter produce the equality such that for each i there is j so that f(di(v))=dj(f(w)). Thus, a new function g can be established by:

g(x)=f(x) if x is different from u, di(v) or dj(w);
g(u)=f(di(v));
g(di(v))=f(u);
g(dj(w))=f(u).

If f(di(v)) is different from f(u), there are (q−1) cases where it is different.

g is a new evenly distributed function. In practice, out of all the circular permutations dk(v), k varying from 0 to q−1, all the values of the shares of the partition do not appear because some are repeated and others are absent.

Thus, for each function f, (q−1) functions g can be established.

This embodiment then makes it possible to construct $q \times (q!)^{C_{n+q-1}^{q-1}/q}$ nonlinear evenly distributed functions for indefinitely great values of n.

In a third embodiment, we consider transitive functions such as, for example, the Boolean functions that are symmetrical by rotation. They make it possible notably to produce curve Boolean functions that are not quadratic unlike the curve symmetrical Boolean functions which are always quadratic. The production of such functions widens the choice of functions to transitivity beyond simple symmetry or symmetry by rotation. A large number of authors have studied the Boolean symmetrical functions but the generalization permitted by the present embodiment on the one hand for the q-ary functions when q is strictly greater than 2 and on the other hand for the partially symmetrical binary or q-ary functions provides novel possibilities.

k is chosen to be a natural integer and p is chosen to be a prime natural integer and $n=p^k$ is calculated, p being to the power of k. A transitive group G of order n is chosen. A transitive Boolean function h of $n=p^k$ variables is defined by assigning a Boolean value, either 0 or 1, to each of the orbits of the group G apart from the two orbits represented by $(0^n)$ and $(1^n)$. The value $$T = \sum_{j=1}^{n-1} C_{n-1}^j h(0^{n-j} 1^j) \mod(2)$$

is calculated.

If p is even, we define $h((0^n))=(T+1) \mod(2)$ and $h((1^n))=T$, and if p is odd we define $h((1^n))=(T+1) \mod(2)$ and $h((0^n))=T$.

The function h is an evenly distributed transitive Boolean function of degree n−1 and therefore highly nonlinear.

In a fourth embodiment, a fourth natural number, a third natural number and the second natural number are chosen such that the first natural number is equal to the sum of the second natural number to the power of the third natural number and the fourth natural number minus 1, the group being a t-transitive group, the step of definition of a function comprises the substeps of:

definition of a t-transitive group of order equal to the second natural number to the power of the third natural number, definition of a transitive Boolean function having a number of variables equal to the second natural number to the power of the third natural number and as group of symmetry, the t-transitive group, definition of a t-transitive Boolean function having a number of variables equal to the first natural number by extension of the transitive Boolean dependent on a number of operands equal to the fourth natural number minus 1.

The method described can be produced in software or hardware form. In particular, a computer program product makes it possible to execute the various steps of the method when it is run on a computer.

For the functions obtained by the proposed method, the technological execution is easy both in software and in hardware. In addition, the properties of the functions prove advantageous for different applications, notably cryptography or data classification.

All the functions constructed can be integrated as a constituent element or in place of a constituent element of any hashing-based cryptographic or data classification method.

The method described is of particular use in cryptography and/or data classification applications.

It is thus applicable notably in the field of secure telecommunications and in other fields such as that of optimized computer storage, telecommunication protocols, electronic voting, online surveys or bidding or biometry. It is suitable for the production of cryptographic mechanisms in terminal, fixed and/or mobile equipment, working on any type of network or in cryptographic modules. In these applications, it makes it possible to offer an improved effectiveness in producing a cryptography solution or a classification solution by hashing or search tree.

The invention claimed is:

1. A computer-implemented method of encoding information by the use of evenly distributed nonlinear functions using program code instructions that when executed on a processor of a computer cause the computer to execute the following steps for constructing such a function comprising:

selection via the processor of a first natural integer n, and of a first set En comprising a number of elements equal to this first natural integer n, selection via the processor of a group G working on this first set En, selection via the processor of a second natural integer q and of a second set Eq comprising a number of elements equal to this second natural integer q, definition via the processor of a set OG of the orbits of the group G working on vectors, having the first natural integer n number of elements of the second set Eq, definition via the processor of a first function Π which, with each of said vectors of the second set Eq, associates the corresponding orbit, definition via the processor of a second function Φ assigning to each of the orbits of the group G a value from the second set Eq, even distribution via the processor in a number of sections equal to the second natural integer q of the sums of the cardinals of the orbits of the group by use of the mathematical properties of said cardinals, definition via the processor of a third function F which is the composite of the first and second functions ΦoΠ.

2. The encoding method as claimed in claim 1, wherein it also comprises a subsequent step of optimizing the nonlinearity or the algebraic degree or an algebraic property of said third function F by swapping orbits.

3. The encoding method as claimed in claim 1, wherein it also comprises a subsequent step of composition at the input, as at the output, with other evenly distributed nonlinear functions so that the overall compound obtained by this step is also nonlinear and evenly distributed.

4. The encoding method as claimed in claim 1, characterized in that the first and second natural integers not being primes between them, the second set Eq being a commutative ring and the group G being the set of the permutations such that the orbits are the entire partitions whose shares are strictly less than the second natural integer q, the step of definition of a first function comprises a substep of construction of a symmetrical affine function $L_{a,b}$:

$$L_{a,b}(x) = b\left(\sum_{i=1}^{n} x_i\right) + a$$

in which a is any element of the second set and b a unit of the second set and $(x_i)_{i=1}^n$ is a vector with n elements of the second set.

5. The encoding method as claimed in claim 1, characterized in that the first and the second natural integers being strictly greater than 2 and primes between them, the set being a commutative ring and the group being the set of the permutations whose orbits have as cardinals the multinomial coefficients, the step of definition of a first function comprises the selection of the trivial evenly distributed functions.

6. The encoding method as claimed in claim 4, characterized in that the selection of trivial evenly distributed functions consists in applying a circular permutation dk with an offset by a third natural integer k over a q-uplet such that, for each value of this third natural integer k:

$$M(n, dk(r_1, r_2, \ldots, r_q)) = M(n, r_1, \ldots, r_q)$$

in which $r_1$, $r_q$ are multinomial coefficients.

7. The encoding method as claimed in claim 6, characterized in that it also comprises a subsequent step of variation of said function by the swapping of orbits having identical cardinals and/or the grouping together of orbits having cardinals that are multiples of one another.

8. The encoding method as claimed in claim 1, characterized in that a third natural number k and the second natural number p are chosen such that the first natural number n is equal to the second natural number p to the power of the third natural number k, said group G being a transitive group, the step of definition of a function comprises the substeps of:

definition of a transitive Boolean function h having a number of variables equal to the first natural number n and displaying a Boolean value at each of the orbits of the group, apart from the orbits On and 1n, calculation of a value T, the sum for all the values of the first natural integer of the product of the binomial coefficient with the first Boolean function h modulo 2, or $$T = \sum_{j=1}^{n-1} C_{n-1}^{j} h(0^{n-j}1^{j}) \bmod(2),$$

calculation of the value of the first Boolean function for the orbits On and 1n such that:

$h(O^n)(T+1) \bmod 2$ and $h(1^n) = T$ if $p$ is even, and $h(O^n) = T$ and $h(1^n) = (T+1) \bmod 2$ if $p$ is odd.

9. The encoding method as claimed in claim 1, characterized in that a fourth natural number t, a third natural number k and the second natural number p are chosen such that the first natural number n is equal to the sum of the second natural number p to the power of the third natural number k and the fourth natural number t minus 1, the group G' being a t-transitive group, the step of definition of a function comprises the substeps of:

definition of a t-transitive group G't of order equal to the second natural number p to the power of the third natural number k, definition of a transitive Boolean function ht having a number of variables equal to the second natural number p to the power of the third natural number k and as group of symmetry, the t-transitive group G't and displaying a Boolean value at each of the orbits of the group, apart from the orbits On and 1n, definition of a t-transitive Boolean function h having a number of variables equal to the first natural number n by extension of the transitive Boolean ht dependent on a number of operands equal to the fourth natural number t minus 1.

10. A computer program product comprising program code instructions that are stored on a non-transitory storage medium, for the execution of the steps of the method as claimed in claim 1 when said program is run on a computer.

11. A cryptography method using an evenly distributed nonlinear function, characterized in that it comprises a method of encoding information as claimed in claim 1.

12. A method of classifying data by hashing or search tree, characterized in that it comprises a method of encoding information as claimed in claim 1.

* * * * *